(12) United States Patent
Hassel et al.

(10) Patent No.: US 10,718,800 B2
(45) Date of Patent: Jul. 21, 2020

(54) METHOD FOR DETERMINING AND OPTIMISING THE ENERGY CONSUMPTION OF A PRODUCTION SYSTEM

(75) Inventors: Jörg Hassel, Erlangen (DE); Amjad Mohsen, Erlangen (DE); Johannes Reinschke, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 694 days.

(21) Appl. No.: 14/399,469

(22) PCT Filed: May 15, 2012

(86) PCT No.: PCT/EP2012/059015
§ 371 (c)(1),
(2), (4) Date: Nov. 6, 2014

(87) PCT Pub. No.: WO2013/170884
PCT Pub. Date: Nov. 21, 2013

(65) Prior Publication Data
US 2015/0120005 A1    Apr. 30, 2015

(51) Int. Cl.
*G01R 21/133* (2006.01)
*G05B 13/04* (2006.01)
*G05B 15/02* (2006.01)
*G06Q 10/06* (2012.01)
*G06Q 10/04* (2012.01)
*G05B 17/02* (2006.01)

(52) U.S. Cl.
CPC .......... *G01R 21/133* (2013.01); *G05B 13/04* (2013.01); *G05B 15/02* (2013.01); *G05B 17/02* (2013.01); *G06Q 10/04* (2013.01); *G06Q 10/06* (2013.01)

(58) Field of Classification Search
CPC .............................. G01R 21/133; G05B 13/04
See application file for complete search history.

(56) References Cited

U.S. PATENT DOCUMENTS

| 4,580,698 | A | * | 4/1986 | Ladt ...................... B65G 47/19 177/122 |
|---|---|---|---|---|
| 6,990,591 | B1 | | 1/2006 | Pearson |
| 7,872,368 | B2 | | 1/2011 | Karimi et al. |
| 8,543,248 | B2 | | 9/2013 | Iino et al. |

(Continued)

FOREIGN PATENT DOCUMENTS

| CN | 102004841 | 4/2011 |
|---|---|---|
| CN | 102144344 | 8/2011 |

(Continued)

OTHER PUBLICATIONS

Planung energieeffizienter Produktionssysteme; Planung energieeffizienter Produktionssysteme N. Weiner( vertStfentlicht in ZWF, Jahrgang 105 pp. 503-507; 2010; DE.

*Primary Examiner* — Umut Onat
(74) *Attorney, Agent, or Firm* — Cozen O'Connor

(57) ABSTRACT

A method for determining the energy consumption of a production system such that the production system can be planned and operated more efficiently in terms of energy, where a load profile of the production system is determined, an energy requirement of the production system is estimated, an energy model of the production system is determined and the energy consumption of the production system is determined.

8 Claims, 4 Drawing Sheets

(56) References Cited

U.S. PATENT DOCUMENTS

| | | | | |
|---|---|---|---|---|
| 2003/0055677 A1* | 3/2003 | Brown | ................... | G06Q 30/06 |
| | | | | 700/291 |
| 2004/0117045 A1* | 6/2004 | Hovland | ................ | G05B 15/02 |
| | | | | 700/97 |
| 2010/0274602 A1* | 10/2010 | Kaufman | ............... | G06Q 10/04 |
| | | | | 705/7.38 |
| 2011/0142751 A1* | 6/2011 | Eickhoff | .................... | B01J 7/02 |
| | | | | 423/648.1 |
| 2011/0173109 A1* | 7/2011 | Synesiou | ............... | G06Q 10/00 |
| | | | | 705/34 |
| 2012/0065793 A1 | 3/2012 | Kaji | | |
| 2012/0103973 A1* | 5/2012 | Rogers | ................... | H05B 6/668 |
| | | | | 219/620 |

FOREIGN PATENT DOCUMENTS

| | | |
|---|---|---|
| CN | 102414951 | 4/2012 |
| DE | 29707245 U1 | 8/1997 |
| DE | 19908317 A1 | 10/2000 |

\* cited by examiner

METHOD FOR DETERMINING AND OPTIMISING THE ENERGY CONSUMPTION OF A PRODUCTION SYSTEM

REFERENCE TO RELATED APPLICATIONS

This is a U.S. national stage of application No. PCT/EP2012/059015 filed 15 May 2012.

BACKGROUND OF THE INVENTION

1. Field of the Invention

The present invention relates to a method for determining an energy consumption of a production system, and to a method for operating the production system.

2. Description of the Related Art

Production systems are currently being simulated during a very early design phase to increase their throughput and efficiency. By way of example, simulation programs such as Plant Simulation from Technomatrix/SIEMENS™ are being used for this purpose. Such programs develop a model for the planned installation or the production system, where the model enables fast simulation and testing of various control strategies. The results of the simulation are used to identify the layout of the production system and control strategies during the design of the production system.

However, a load-dependent energy consumption cannot be determined with the aid of the simulation programs currently in use. During the design of the production system, the energy consumption is estimated "by hand", and this normally leads to a substantial overestimation of the energy consumption. Moreover, it is impossible to optimize the operation of the production system to reduce the energy consumption with the aid of the previously named programs. However, this is an important aspect with regard, in particular, to environmental protection and rising energy prices.

In the article, entitled "Planung energieeffizienter Produktionssysteme" ["Planning energy-efficient production systems"] by N. Weinert, published in ZWF, No. 105, 2010, it is pointed out that in the case of a production system it is possible for different operating states, such as the run-up, the warm-up, waiting states, the processing state or a switch-off operation to occur. These operating states, which have a different energy requirement, are assigned to appropriate blocks which are modeled and simulated.

SUMMARY OF THE INVENTION

It is an object of the present invention to provide a way in which a production system can be planned and operated more efficiently in terms of energy.

This and other objects and advantages are achieved in accordance with the invention by providing a method for determining an energy consumption of a production system that comprises a) determining a load profile of the production system with the aid of a load-calculating device, b) estimating an energy requirement of the production system with the aid of an energy-calculating device by using the determined load profile and an electromechanical model of the production system, c) determining an energy model of the production system by using the estimated energy requirement, and d) determining the energy consumption of the production system with the aid of the load-calculating device as a function of the energy model and a load transported and/or processed with the aid of the production system.

The energy consumption of the production system can advantageously be estimated with the aid of the method in accordance with the invention. Any installation, production installation or the like is to be understood below by the term production system. In particular, the production system can comprise a conveyor belt on which a load is moved and/or transported. The first step is to determine a time-dependent load profile of the production system with the aid of the load-calculating device. The load-calculating device can comprise a computing device, such as a computer, a microprocessor or the like, on which a simulation program for a production system, such as Plant Simulation, is run. Realistic basic assumptions are made in this case with reference to the throughput. Subsequently, an energy requirement of the production system is determined with the aid of an energy-calculating device. The energy-calculating device can comprise a computing device, such as a computer, a microprocessor or the like, on which a program is run with the aid of which the power of a system can be estimated. Such a program can be, for example, the SIZER program from SIEMENS™.

The production system is preferably subdivided into individual regions, and the method is performed for each of the regions. It is thereby possible to determine the energy consumption with particular exactitude as a function of the design of the production system. In this case, regions of the production system that are the same can be calculated on a single occasion. The energy consumption of the production system can thereby be determined with particular efficiency.

In one embodiment, in step a) the load profile is determined as a function of operating variables of the production system which describe a speed, an acceleration, a basic weight of the production system and/or a weight of the load. Here, load profile is determined for each region of the production system, in particular. Here, account is taken of the speed and/or the acceleration of the production system, or of a part of the production system, and of the weight of the goods transported with the aid of the production system. Subsequently, the load profile can be analyzed and, if appropriate, converted into another data format. Upon conversion into another data format, the file that includes information relating to the load profile can also be subdivided into a plurality of individual files. This is particularly favorable when the load profile has been determined over a relatively long period, such as a day.

In step b) the electromechanical model is preferably determined as a function of parameters of drive devices of the production system, and as a function of the dimensions of the production system. The electromechanical model can include those parameters with the aid of which the electromechanical system of the production system can be adequately described. The electromechanical model can include information relating to the types of the electric machines, starters, converters, input/output elements or the like that are used. In addition, the electromechanical model can include information concerning the length and width of the individual regions of the production system.

In a further embodiment, in step c) the energy model is determined as a function of the operating variables of the production system. For this purpose, it is preferable to set up a mathematical equation with the aid of which the required power and energy of the production system, or of regions of the production system, can be modeled. In addition, it is possible to develop a mathematical model in which the proportion of the power consumed overall is determined for each variable in the mathematical equation. The energy model can be represented in general form by the following relationship:

$$P_i = K_1 \cdot V_{i1}^{j1} + K_2 \cdot V_{i2}^{j2} + \ldots + K_n \cdot V_{in}^{jn} \qquad \text{Eq. 1}$$

Here, the variables $V_{i1}$ to $V_{in}$ describe the speed and/or the acceleration of the individual regions of the production system, and the load that is transported with the aid of the respective regions of the production system. These variables describe the energy consumption in the physical system. j is a real number specifying the order of the respective variables. There can be a relationship between the variables, such as the speed and the acceleration. The constants $K_1$ to $K_n$ describe power constants.

The load profile determined with the aid of the load-calculating device can be subdivided into m individual files. The individual files can be fed successively to the energy-calculating device. Together with the information concerning the electromechanical system, the energy-calculating device can be used to estimate the required energy and/or power for each region of the production system. The following matrix relationship can be set up by using the m estimated values for the power:

$$\begin{bmatrix} P_1 \\ P_2 \\ \vdots \\ P_m \end{bmatrix} = \begin{bmatrix} V_{11}^{j1} & V_{12}^{j2} & \ldots & V_{1n}^{jn} \\ V_{21}^{j1} & V_{22}^{j2} & \ldots & V_{2n}^{jn} \\ \vdots & & & \\ V_{m1}^{j1} & V_{m2}^{j2} & \ldots & V_{mn}^{jn} \end{bmatrix} * \begin{bmatrix} K_1 \\ K_2 \\ \vdots \\ K_n \end{bmatrix} \qquad \text{Eq. 2}$$

The matrix equation can be solved for the power factors $K_1$ to $K_n$ in order to determine them.

In a preferred embodiment, in step c) at least one of the operating variables is assumed to be constant, and a power table is determined as a function of the operating variables not assumed to be constant. When the speed of the production system is constant for a specific period, the acceleration of the production system assumes the value of zero. The energy model can therefore be determined with the aid of the energy-calculating device only as a function of the weight of the production system and/or of the moving load. When the variables in the equation for the energy model are assumed to be constant for a specific period, the relationship can be rewritten as a function of one variable:

$$P_i = C_1 \cdot V_{im}^{jm} + C_2 \qquad \text{Eq. 3}$$

In this case, $C_1$ and $C_2$ are constants that can be determined with the aid of the energy-calculating device. For this purpose, the constants can be estimated for each possible value of the variables. The results of the estimation can be stored in one or more power tables for each region of the production system.

In another embodiment, at least one of the operating variables of the production system is determined by using measurements. For this purpose, it is possible to perform physical measurements on the production system during operation. The operating variables can be determined with particular accuracy with the aid of the data of the measurements. The energy consumption of the production system can be determined exactly based on the measurements.

It is preferred that in step d) the energy consumption of the production system is determined as a function of the energy model, or of the power table. The load-calculating device is fed the power tables and the energy model. The power constants can also be fed to the load-calculating device instead of the energy model. It is possible to use the power tables and/or the energy model to determine the energy consumption of the production system dynamically with the aid of the load-calculating device, doing so as a function of a temporally variable load conveyed with the aid of the production system. This enables the instantaneous power, the average power and the energy to be calculated. The average power can be calculated for a prescribed time interval, such as a second:

$$P_{avg} = \frac{\sum_{i=n_0}^{n_1} P_i \cdot T_i}{\sum_{i=n_0}^{n} T_i} \qquad \text{Eq. 4}$$

$$E = \sum_{i=n_0}^{n_1} P_i \cdot T_i$$

When simulating the production system, the load-calculating device calculates the energy consumption of the production system by using the operating variables. The average power and the energy are calculated for n time intervals.

This facilitates a simple calculation of the energy consumption of the production system in which fewer resources are required to store the energy model in a memory of the load-calculating device. The additional calculation of the energy consumption does not have a negative effect on the load-calculating device with reference to the computing capacity. In addition, the energy consumption of the production system can be determined quickly and reliably.

It is, furthermore, advantageous when in step d) at least one of the operating variables is examined at at least two consecutive instants to determine the energy consumption. By way of example, the load-calculating device can be used to take account of the speed of the production system at two consecutive instants to determine the energy consumption of the production system. When there is no change in the speed at at least two consecutive instants, the values for the load on the load table for the respective regions of the production system can be used to determine the energy consumption. When there is a change in the speed at at least two consecutive instants, the energy model can be used to calculate the energy consumption.

It is possible thereby to, provide a hybrid approach to determine the energy consumption of the production system. Based on an estimation, it may be assumed that the power tables are used to calculate the energy consumption in 70% of cases. This substantiates the additional requirement for resources, which is covered by the storage of the power tables. Moreover, the energy consumption can be determined more reliably.

For the case in which the energy consumption for a planned production system, or regions thereof, cannot be determined with the aid of the load-calculating device, the method or the simulation is terminated and an appropriate message is output. In addition, it is possible to access the energy-calculating device by operator input, thus enabling the missing variables and/or parameters for the energy model or for the power table to be determined with the energy-calculating device.

In the case of the method in accordance with the invention for operating a production system, the production system is operated as a function of the energy consumption, which has been determined with the aid of the method previously described. In this case, the production system can be driven with the aid of the load-calculating device. The production system can thereby be operated with particular energy efficiency. The load-calculating device calculates the energy consumption of the production system by using the operating variables during simulation of the production system. The average power and the energy are calculated for n time intervals.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention is now explained in more detail by using the attached drawings, in which.

DETAILED DESCRIPTION OF THE PREFERRED EMBODIMENTS

The exemplary embodiments outlined in more detail below constitute preferred embodiments of the present invention.

Figure 1:
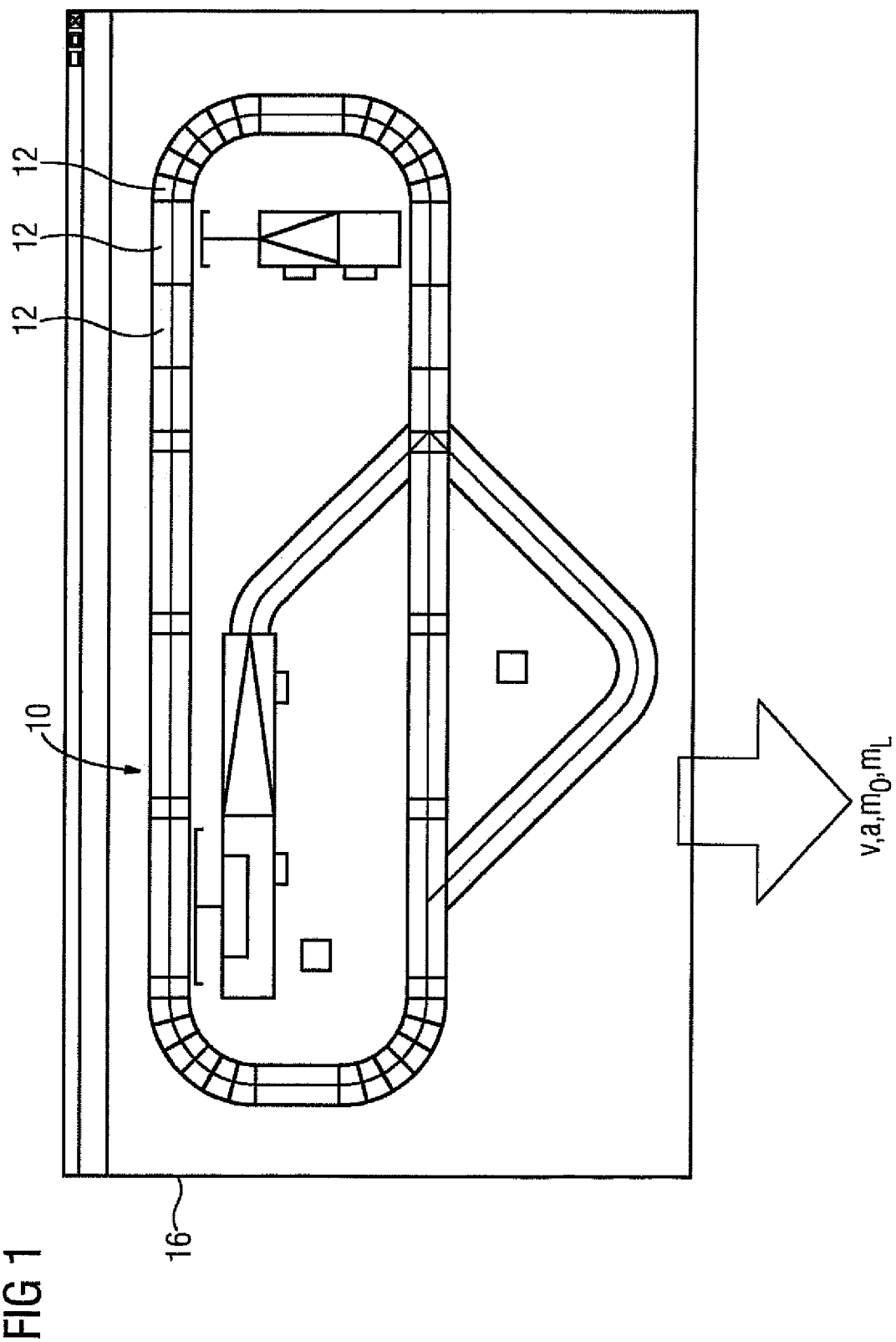
FIG. 1 is a schematic of a production system.

FIG. 1 is a schematic of a production system 10. In the exemplary embodiment illustrated here, the production system 10 is a baggage conveyor system of an airport. A load-calculating device 16 is used in order to be able to calculate the throughput of the production system 10. The load-calculating device 16 can be provided by an appropriate simulation program which is run on a computer, a microprocessor, an ASIC or the like. The Plant Simulation program, for example, can be used as simulation program.

The production system 10 is subdivided into a plurality of regions 12, or sections, in order to be able to calculate and/or simulate the production system 10. The individual regions 12 can have different geometrical dimensions in this case. A speed/acceleration of the belt of the baggage conveyor system can be assigned to each of the regions 12 of the production system 10. In addition, a length, a width and a geometrical shape can be assigned to each region 12.

A load profile 18 of the production system 10 can be determined with the aid of the load-calculating device 16. The load profile 18 is determined as a function of operating variables of the production system 10, which include a speed v, an acceleration a, a basic weight $m_0$ of the production system and/or a weight $m_L$ of a load moved with the aid of the production system.

Figure 3:
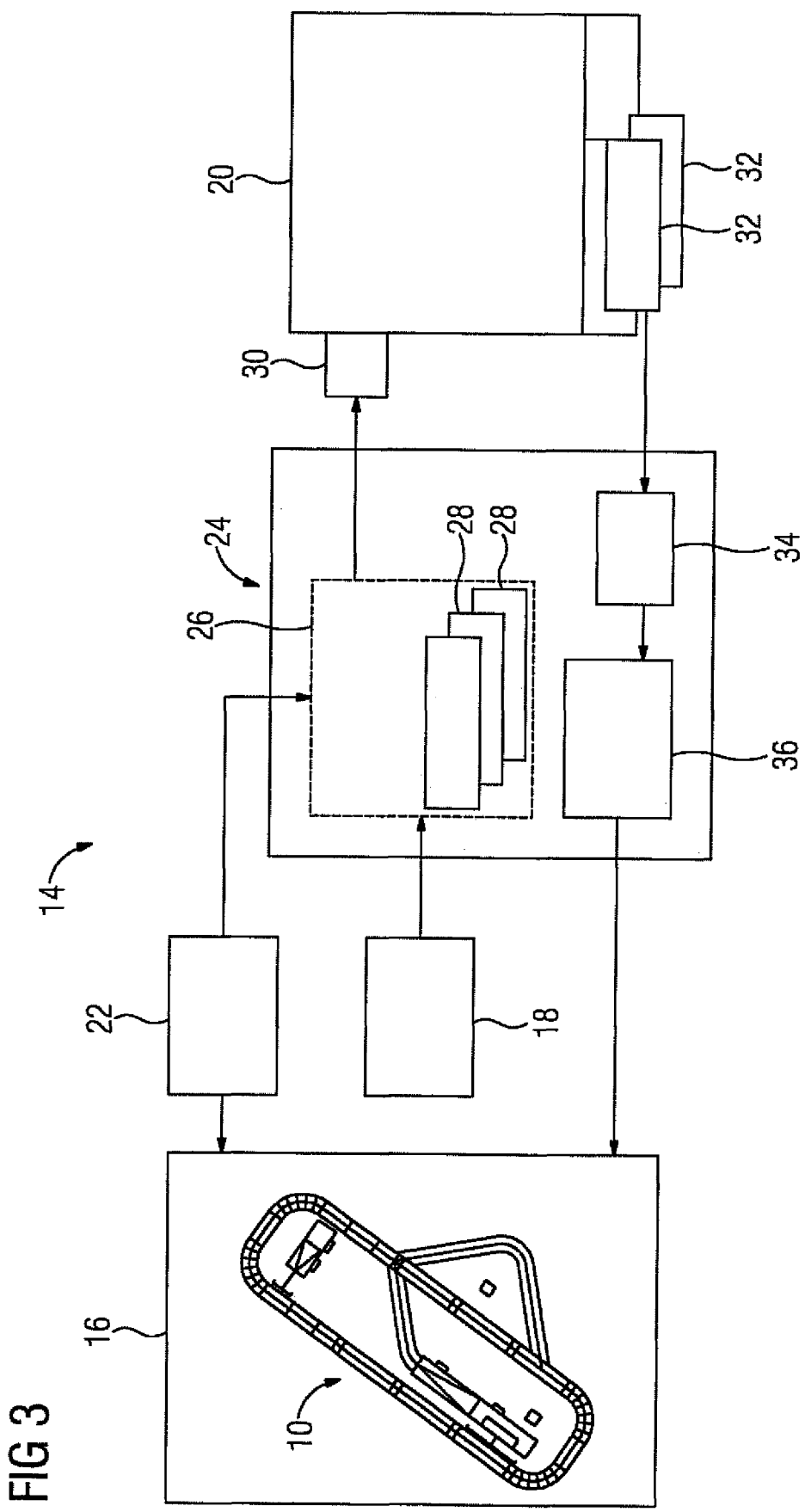
FIG. 3 is a schematic intended to illustrate the method for determining the energy consumption of the production system in a further embodiment.

FIG. 3 shows a further illustration 14, which illustrates the method for determining an energy consumption of the production system 10. The load-calculating device 16 previously described, with the aid of which the load profile 18 of the production system 10 is determined, is required to perform the method. The load profile 18 can, for example, be determined for a day (86 400 seconds). In this case, it is possible for each of the operating variables of the individual regions 12 of the production system 10 to be determined for prescribed time intervals, such as a second.

Moreover, an energy-calculating device 20 is required to implement the method. The energy-calculating device 20 can be provided by an appropriate program which is run on a computer, a microprocessor, an ASIC or the like. The SIZER program, for example, can be used as the program.

An electromechanical model 22 is stored for the production system 10. It is preferred to this end for information concerning the components of the production system 10 to be stored in a table for each region 12 of the production system 10. The electromechanical model 22 can include technical, electrical and/or geometric parameters of the electric drives, converters, starters or the like. The information can be determined by physical measurements. In addition, the electromechanical model 22 can include information concerning the dimensions of the individual regions 12 of the production system 10. Thus, the length, the width and, if appropriate, a spatial arrangement of the baggage belt can be stored. The electromechanical model 22 is used as reference. Firstly, the data of the electromechanical model 22 are fed to the load-calculating device 16, and secondly the data of the electromechanical model 22 are fed to a data-calculating device 24.

The data-calculating device 24 can be provided by a computing device on which a program, such as MATLAB™ or C is run. The data-calculating device 24 creates a parameter file 26 that can be processed by the energy-calculating device 20. The parameter file 26 is determined by the data-calculating device 24 by using the electromechanical model 22. Here, a parameter file 26 can be on hand for each region 12 of the production system 10. In addition, the data-calculating device 24 receives the data of the load profile 18 and subdivides the data into a plurality of individual files 28, each individual file 28 being assigned to a region 12 of the production system 10.

Figure 2:
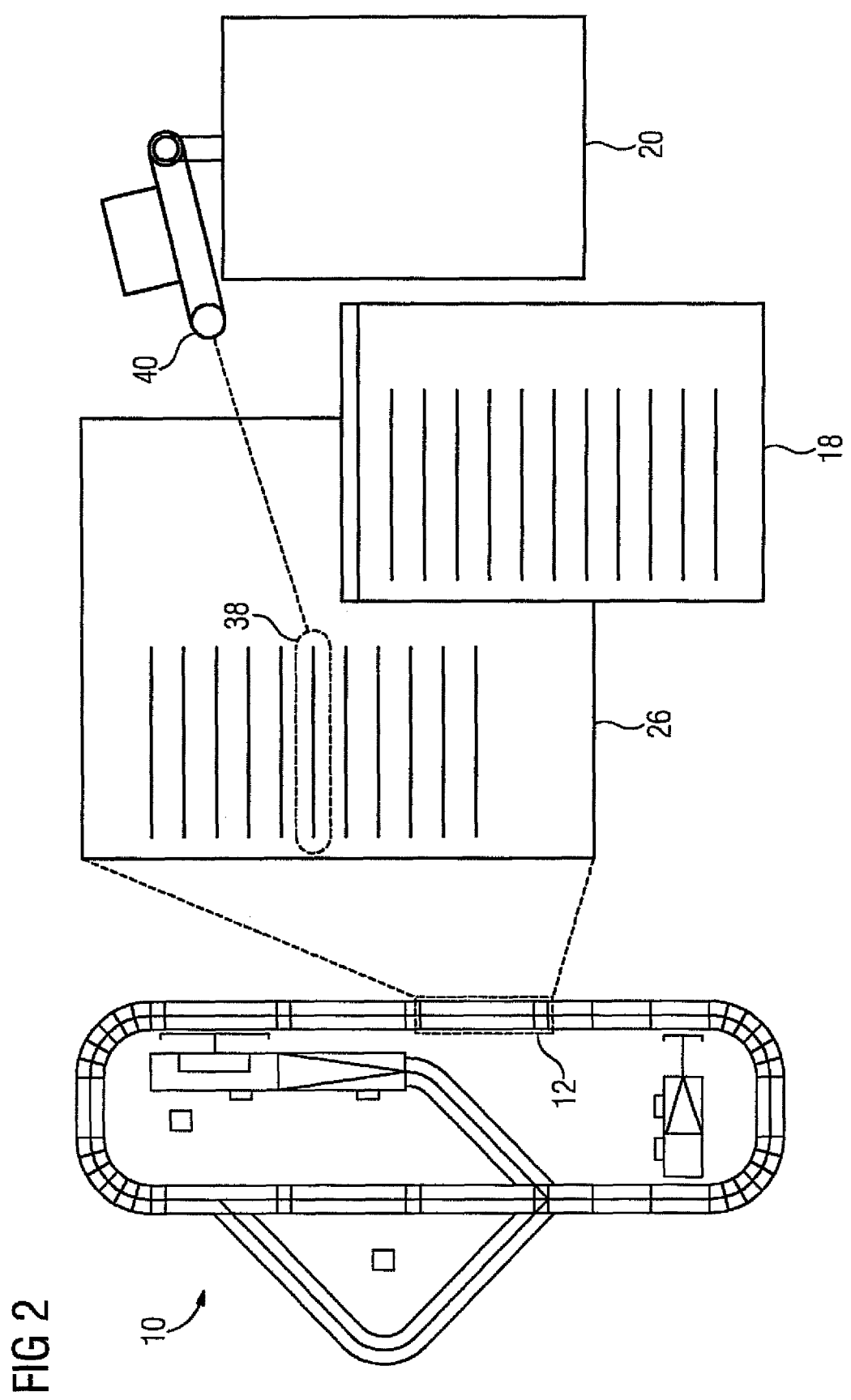
FIG. 2 is a schematic intended to illustrate a method for determining an energy consumption of the production system.

FIG. 2 shows that a parameter file 26 is assigned to a region 12 of the production system 10. The parameter file 26 includes a plurality of rows and/or entries. Here, an entry 38 is assigned to the diameter of a drive roller 40 of the production system 10 in the region 12.

The energy-calculating device 20 is repeatedly called upon to determine the energy requirement of the individual regions 12 of the production system 10. The same parameter file 26 is used in this case, but a new individual file 28 is provided with each program call until all the individual files 28 have been processed with the aid of the energy-calculating device 20. An interface 30 is provided so that the data-calculating device 24 can call a program on the energy-calculating device 20.

The energy-calculating device 20 generates output files 32 after each program call. The output files 32 include information concerning the power consumption and/or energy consumption as a function of the electromechanical model 22 and the load profile 18. The output files 32 are transmitted to the data-calculating device 24, analyzed and optimized there in block 34 and stored as energy model 36. Said process is repeated for all regions 12 of the production system 10.

The energy model 36 is subsequently determined for each region 12 of the production system 10. For this purpose, the operating variables, which influence the energy consumption of the production system 10, are firstly specified in accordance with the following relationship:

$$P_1 = \eta_1 \cdot (m_0 + m_{Li}) \cdot a_i \cdot v_i + \eta_2 \cdot (m_0 + m_{Li}) \cdot v_i^2 \quad \text{Eq. 5}$$
$$= \eta_1 \cdot m_0 \cdot a_i \cdot v_i + \eta_1 \cdot m_{Li} \cdot a_i \cdot v_i + \eta_2 \cdot m_0 \cdot v_i^2 + \eta_2 \cdot m_{Li} \cdot v_i^2$$
$$= K_1 \cdot a_1 \cdot v_1 + K_2 \cdot m_{Li} * a_1 \cdot v_1 + K_3 \cdot v_i^2 + K_4 \cdot m_{Li} \cdot v_i^2$$

Here, the constants $K_1$ to $K_4$ describe said so-called power constants for each region 12 of the production system 10. The mathematical model can also be represented as a matrix relationship to be able to calculate the power constants $K_1$ to $K_4$:

$$\begin{bmatrix} \overline{P}_1 \\ \overline{P}_2 \\ \vdots \\ \overline{P}_N \end{bmatrix} = \begin{bmatrix} \overline{a_1 \cdot v_1} & \overline{m_{L1} \cdot a_1 \cdot v_1} & \overline{v_1^2} & \overline{m_{L1} \cdot v_1^2} \\ \overline{a_2 \cdot v_2} & \overline{m_{L2} \cdot a_2 \cdot v_2} & \overline{v_2^2} & \overline{m_{L2} \cdot v_2^2} \\ \vdots & \vdots & \vdots & \vdots \\ \overline{a_N \cdot v_N} & \overline{m_{Ln} \cdot a_n \cdot v_n} & \overline{v_N^2} & \overline{m_{LN} \cdot v_N^2} \end{bmatrix} \cdot \begin{bmatrix} K_1 \\ K_2 \\ K_3 \\ K_4 \end{bmatrix} \quad \text{Eq. 6}$$

Here, the index N in the above relationships represents the number of individual files 28 which are fed to the energy-calculating device 20. In order to calculate the power constants $K_1$ to $K_4$, the N estimated values of the energy requirement which have been determined with the aid of the energy-calculating device 20 are employed to solve the matrix relationship of Eq. 6.

In addition, a power table is determined for each region 12 of the production system 10. One of the operating variables is assumed to be constant for this purpose. For example, the speed v is assumed to be constant, and the weight $m_L$ of the load is determined. As an alternative to the power tables, it is possible to provide a simplified relationship:

$$P_i = C_1 \cdot (m_0 + m_L) + C_2 \quad \text{Eq. 7}$$

Lastly, the load-calculating device 16 is extended in order that it can be used to determine the energy consumption and/or power consumption of the production system 10 for a temporally variable load. When the calculation or simulation is started, the load-calculating device 16 calculates the current energy consumption or power consumption for each region 12 of the production system 10. The operating variables of the production system 10 are used for this purpose. Here, the speed v of a region 12 of the production system 10 is compared with itself at consecutive instants. When there is no change in the speed v, the power tables or the simplified equation are/is used to determine the energy consumption of the production system 10 as a function of the weight $m_L$ of the temporally variable load. When the speed v changes, the energy consumption is determined by using the mathematical relationship or the matrix relationship.

By way of example, the baggage conveyor system is firstly in a state of rest and moves at the minimum speed v of 0.3 m/s. When a baggage item enters, the speed v of the baggage conveyor system is accelerated until it reaches the maximum speed of, for example, 2 m/s. The acceleration a of the baggage conveyor system can be prescribed in this case. During the acceleration, the speed v, the acceleration a, the mass $m_0$ and the weight $m_L$ of the load are variables. In this case, the mathematical relationship is used to determine the energy consumption of the baggage conveyor system or of the production system 10. However, when the baggage conveyor system has reached the maximum speed v, the total weight ($m_0+m_L$) is the only variable. In this case, the power tables are used to determine the energy consumption as a function of the instantaneous total weight.

Following thereupon, if no baggage item is being transported and the total weight assumes the value zero, the load-calculating device 16 outputs a signal to the effect that the speed v of the production system 10 is reduced in stepwise fashion. Until the minimum speed is reached, the mathematical relationship is used to determine the instantaneous energy consumption.

By way of example, when the number of baggage items, and thus the total load exerted on the individual regions 12, is altered, it can happen that the energy consumption can no longer be determined with the aid of the load-calculating device 16. In this case, a complete description of the load profile 18 is output. The energy-calculating device 20 is once again prompted to update the power tables. The load-calculating device 16 can utilize the updated power tables to operate the production system.

Figure 4:
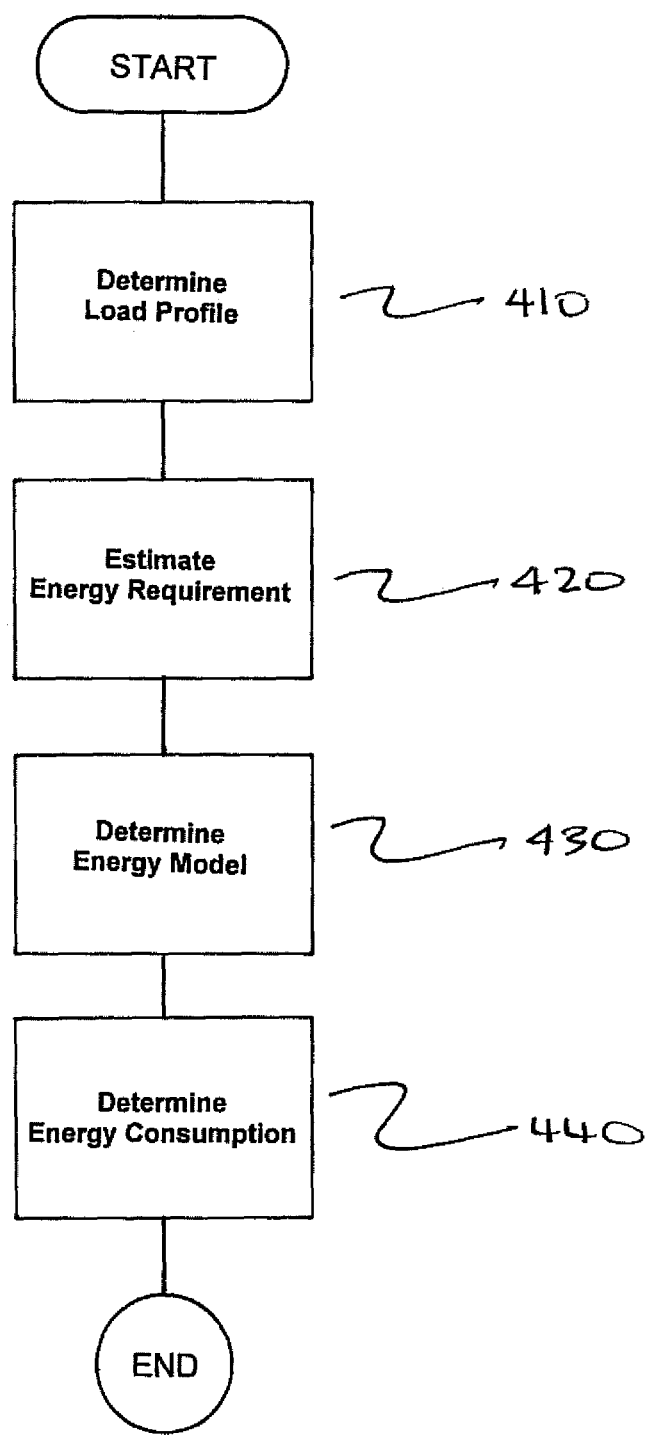
FIG. 4 is a flowchart of the method in accordance with the invention.

FIG. 4 is a flowchart of a method for determining an energy consumption of a production system (10). The method comprises determining a load profile (18) of the production system (10) via a load-calculating device (16), as indicated in step 410.

The energy requirement of the production system (10) is estimated via an energy calculating device (20) by utilizing the determined load profile (18) and an electromechanical model (22) of the production system (10), as indicated in step 420. Next, the energy model (36) of the production system (10) is determined via the estimated energy requirement, as indicated in step 430.

The energy consumption of the production system (10) is then determined via the load calculating device (16) as a function of the energy model (36) and a load at least one of transported and processed aided by the production system (10), as indicated in step 440.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for determining an energy consumption of a production system, comprising:
    a) determining a physical load profile of the production system for each individual region of the production system separately over a period of time comprising a day as a function of operating variables of the production system which describe at least a basic weight of the production system and a weight of a physical load via a load-calculating device;
    b) estimating an energy requirement of the production system via an energy-calculating device by utilizing the determined physical load profile and an electromechanical model of the production system;

c) determining an energy model of the production system via the estimated energy requirement, at least one of the operating variables being assumed to be constant, and a power table being determined as a function of the operating variables not assumed to be constant;

d) determining the energy consumption of the production system via the load-calculating device as a function of the energy model and a physical load at least one of transported and processed aided by the production system; and e) operating the production system based on the determined energy consumption of the production system to reduce a rate at which the production system consumes energy.

2. The method as claimed in claim 1, wherein the production system is subdivided into individual regions, and the method is performed for each of the individual regions.

3. The method as claimed in claim 1, wherein during step b) the electromechanical model is determined as a function of parameters of drive devices of the production system, and as a function of dimensions of the production system.

4. The method as claimed in claim 1, wherein during step c) the energy model is determined as a function of the operating variables of the production system.

5. The method as claimed in claim 1, wherein at least one of the operating variables of the production system is determined by using measurements.

6. The method as claimed in claim 1, wherein during step d) the energy consumption of the production system is determined as a function of the energy model, or as a function of the power table.

7. The method as claimed in claim 1, wherein during step d) at least one of the operating variables is examined at at least two consecutive instants to determine the energy consumption.

8. The method as claimed in claim 1, wherein said operating variables of the production system further describe at least one of speed and an acceleration of the production system.

* * * * *